(12) United States Patent
Choi et al.

(10) Patent No.: US 9,691,995 B2
(45) Date of Patent: Jun. 27, 2017

(54) METHOD OF MANUFACTURING SUBSTRATE FOR ORGANIC ELECTRONIC DEVICE

(71) Applicant: LG CHEM, LTD., Seoul (KR)

(72) Inventors: Jun Rye Choi, Daejeon (KR); Jung Hyoung Lee, Daejeon (KR); Ji Hee Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/910,230

(22) PCT Filed: Dec. 4, 2014

(86) PCT No.: PCT/KR2014/011830
§ 371 (c)(1),
(2) Date: Feb. 4, 2016

(87) PCT Pub. No.: WO2015/084073
PCT Pub. Date: Jun. 11, 2015

(65) Prior Publication Data
US 2016/0204365 A1    Jul. 14, 2016

(30) Foreign Application Priority Data

Dec. 4, 2013   (KR) .................. 10-2013-0150083
Dec. 4, 2014   (KR) .................. 10-2014-0172954

(51) Int. Cl.
*H01L 51/00*    (2006.01)
*H01L 51/52*    (2006.01)
(Continued)

(52) U.S. Cl.
CPC .......... *H01L 51/0097* (2013.01); *G02B 1/041* (2013.01); *H01L 51/0035* (2013.01);
(Continued)

(58) Field of Classification Search
None
See application file for complete search history.

(56) References Cited

U.S. PATENT DOCUMENTS 9,257,675 B2    2/2016 Jang et al.
2011/0024779 A1*  2/2011 Nakamura ............ B82Y 20/00
                                                              257/98
(Continued)

FOREIGN PATENT DOCUMENTS

CN    103201869 A    7/2013
JP    2000-321406 A    11/2000
(Continued)

*Primary Examiner* — Joseph Schoenholtz
(74) *Attorney, Agent, or Firm* — Dentons US LLP (57) ABSTRACT

Provided are a method of manufacturing a substrate, a method of manufacturing an organic electronic device (OED), a substrate, an OED, and a use thereof. The method of manufacturing a substrate which may provide an OED having an element with improved efficiency may be provided. In addition, a substrate having excellent surface roughness, and a refractive index or a light scattering property, which is suitably controlled according to a desired effect may be manufactured, and therefore the substrate capable of forming an OED having excellent reliability and efficiency and the method of manufacturing an OED may be provided. Moreover, a substrate and an OED, which are manufactured by the above methods, and their uses may be provided. The manufacturing method may be effectively applied to manufacture, for example, a flexible element.

17 Claims, 2 Drawing Sheets

(51) Int. Cl.
  *G02B 1/04* (2006.01)
  *H01L 51/56* (2006.01)
(52) U.S. Cl.
  CPC ...... *H01L 51/0043* (2013.01); *H01L 51/5268* (2013.01); *H01L 51/5275* (2013.01); *H01L 51/5281* (2013.01); *H01L 51/56* (2013.01); *H01L 2251/301* (2013.01); *H01L 2251/303* (2013.01); *H01L 2251/5338* (2013.01); *H01L 2251/5361* (2013.01); *Y02E 10/549* (2013.01); *Y02P 70/521* (2015.11)

(56) References Cited

U.S. PATENT DOCUMENTS

| | | |
|---|---|---|
| 2011/0196109 A1 | 8/2011 | Cho et al. |
| 2011/0318588 A1 | 12/2011 | Fukukawa et al. |
| 2012/0223350 A1 | 9/2012 | Tanaka et al. |
| 2014/0001448 A1* | 1/2014 | Naraoka ............. H01L 51/5275 257/40 |
| 2014/0197387 A1* | 7/2014 | Miyao ................ C08J 5/005 257/40 |
| 2015/0104891 A1 | 4/2015 | Kim et al. |
| 2015/0225523 A1* | 8/2015 | Suenaga ............ C08G 73/1039 428/435 |
| 2015/0236300 A1* | 8/2015 | Naraoka ............. H01L 51/5262 257/40 |
| 2016/0141528 A1* | 5/2016 | Masuyama .......... G02B 5/1814 257/40 |
| 2016/0155990 A1* | 6/2016 | Han .................... H01L 51/5275 428/312.6 |

FOREIGN PATENT DOCUMENTS

| | | |
|---|---|---|
| JP | 2002-332349 A | 11/2002 |
| JP | 3861758 B2 | 12/2006 |
| JP | 2007-335253 A | 12/2007 |
| JP | 2009-76452 A | 4/2009 |
| JP | 2010-040211 A | 2/2010 |
| JP | 2011-173335 A | 9/2011 |
| JP | 2012-000811 A | 1/2012 |
| JP | 2012-107178 A | 6/2012 |
| JP | 2013-76026 A | 4/2013 |
| JP | 2013-077410 | 4/2013 |
| JP | 2013-539182 A | 10/2013 |
| KR | 10-2009-0042256 | 4/2009 |
| KR | 10-1114352 B | 2/2012 |
| KR | 10-2012-0024510 A | 3/2012 |
| KR | 2012-0024510 A | 3/2012 |
| WO | 2008139370 A1 | 11/2008 |
| WO | 2013141673 A1 | 9/2013 |
| WO | 2015084073 A1 | 6/2015 |

\* cited by examiner

METHOD OF MANUFACTURING SUBSTRATE FOR ORGANIC ELECTRONIC DEVICE

This application is a National Stage Entry of International Application No. PCT/KR2014/011830, filed Dec. 4, 2014, and claims the benefit of Korean Application No. 10-2013-0150083, filed on Dec. 4, 2013, and Korean Application No. 10-2014-0172954, filed Dec. 4, 2014, all of which are hereby incorporated by reference in their entirety for all purposes as if fully set forth herein.

TECHNICAL FIELD

The present application relates to a method of manufacturing a substrate for an organic electronic device (OED), a substrate for an OED, an OED, and a use thereof.

BACKGROUND

OEDs include an organic light emitting device (OLED), an organic photovoltaic cell, an organic photoconductor (OPC), or an organic transistor. For example, conventionally, a representative OLED sequentially includes a glass substrate, a transparent electrode layer, an organic layer including an emitting unit, and a reflective electrode layer.

In a structure called a bottom emitting device, the transparent electrode layer may be formed as a transparent electrode layer, and the reflective electrode layer may be formed as a reflective electrode layer. In addition, in a structure called a top emitting device, the transparent electrode layer may be formed as a reflective electrode layer, and the reflective electrode layer may be formed as a transparent electrode layer. Electrons and holes are injected into the electrode layer, and recombined in an emitting unit, thereby generating light. The light may be emitted to the substrate in the bottom emitting device, or to the reflective electrode layer in the top emitting device.

Among lights incident from the organic layer, one emitted at a critical angle or more to an interface of each layer is trapped due to total internal reflection, and only a very small amount of light is emitted. Accordingly, for example, as disclosed in the patent document 1, there is an attempt to increasing light extraction efficiency. However, a technique of extracting light that has been known so far generally premises a use of a rigid substrate such as a glass substrate, and is not effectively applied to a device using a flexible substrate having a different characteristic to the glass substrate.

PRIOR ART DOCUMENT

Patent Document

PATENT DOCUMENT 1: Japanese Patent No. 3861758

DESCRIPTION

Technical Object

The present application is directed to providing a method of manufacturing a substrate which can provide an OED having an improved efficiency of an element. According to the present application, a substrate having excellent surface smoothness and a refractive index or light scattering property suitably controlled according to a desired effect may be manufactured, and therefore an OED having excellent reliability and efficiency may be provided. The present application is also directed to providing a substrate manufactured by the above-described method, an OED, and a use thereof. The manufacturing method of the present application may be effectively applied to manufacture, for example, a flexible element.

Technical Solution

In one aspect, the method of manufacturing a substrate for an OED may include forming a concavo-convex pattern on at least one surface of a flexible base layer such as a polymer base layer or a layer of a precursor of the base layer. Here, the precursor of the base layer may be, for example, prepared to form the polymer base layer, and may be a mixture of a monomer which may form the polymer, or a partial polymer thereof. In addition, the method of manufacturing an OED may include forming a concavo-convex pattern on at least one surface of a base layer, for example, the flexible base layer, and forming an organic electronic element on the base layer using the base layer having the concavo-convex pattern as a substrate.

The concavo-convex pattern formed on the base layer may improve light extraction efficiency of the device, for example, when the OED is a device for emitting light (e.g. OLED).

Figure 1:
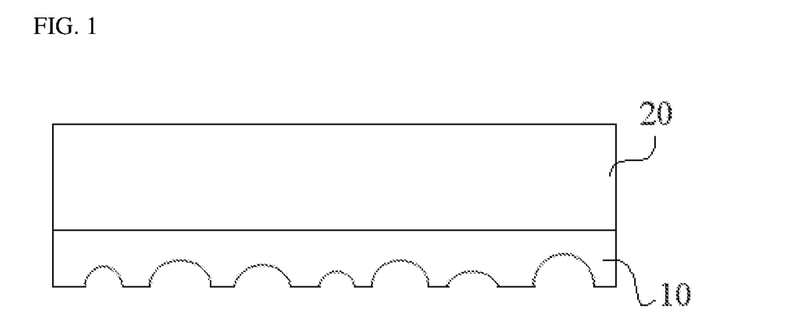
FIGS. 1 and 2 shows illustrative organic electronic device.

For example, the OED manufactured by the above method may have a structure shown in FIG. 1. The concavo-convex pattern formed under a substrate 10 in the structure of FIG. 1 may have a function of scattering light emitted from an organic electronic element 20 due to an interaction with an external environment such as an air. Such a function can be exhibited by controlling a refractive index of the substrate 10, for example, a base layer. That is, when the refractive index of the substrate 10 is adjusted to be different from the external environment such as an air, an effect of scattering light due to the concavo-convex structure may be exhibited. As another method, a method of making a base layer to exhibit a suitable haze may be applied as will be described below. In addition, as will be described below, as an additional element, which is the same as or different from the base layer, is formed in the formed concavo-convex pattern, the above-described effect may be achieved.

Figure 2:
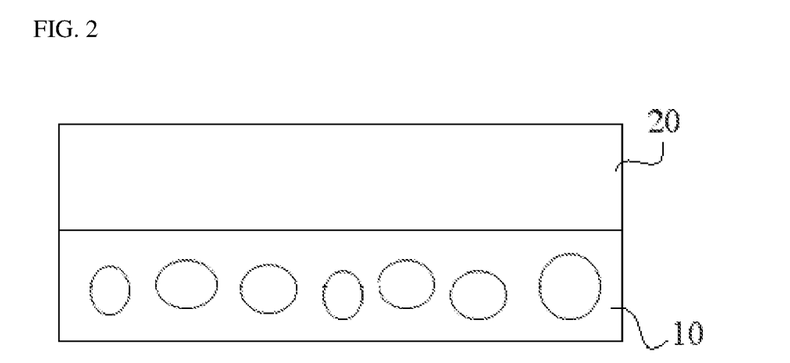

FIG. 2 is a diagram showing another example of an OED manufactured by a method of the present application. In FIG. 2, a space is formed in the base layer 10, and may be manufactured by a method of forming another base layer on a surface of the base layer having a concavo-convex pattern on at least one surface or a layer of a precursor thereof, on which a concavo-convex pattern is formed. The base layer formed on the surface of the base layer on which the concavo-convex pattern is formed may be a base layer having or not having a concavo-convex pattern. The base layer additionally formed as described above may be formed using a material which is the same as or different from that of the base layer having the concavo-convex pattern. In this structure, the scattering effect may be exhibited due to a space formed in the base layer.

Figure 3:
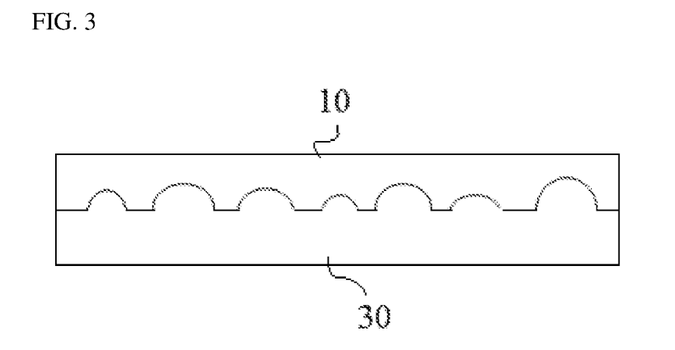
FIG. 3 is a diagram showing the method, by which the concavo-convex pattern is formed on the base layer.

In this manufacturing method, a method of forming a concavo-convex pattern on one surface of a base layer is not particularly limited. For example, a molding method of pressing a mold on a suitable plastic base layer may be applied. In another method, the concavo-convex pattern may be formed by forming the base layer or a layer of a precursor thereof on the mold having a concavo-convex surface to correspond to the concavo-convex surface of the mold. The layer may be formed by a coating method when the base layer or a precursor thereof is a solution type, or when the base layer or a precursor thereof is a film type, may be formed by pressing the film disposed on the mold in a lower direction. FIG. 3 is a diagram showing the above method, in which a base layer 10 or a precursor 10 thereof is formed on a mold 30 having a concavo-convex pattern. Here, a molding method is applied or the base layer coated on the mold is a plastic base layer applied as a substrate, or a precursor which can form the base layer. For example, a coating solution which can form a polymer is coated on the mold and cured in this state, thereby forming a polymer, and thus a base layer having a concavo-convex pattern on one surface may be formed. In addition, while a layer of the precursor which can form a polymer is formed, the mold may be pressed on its surface, and the precursor may be polymerized, thereby forming a concavo-convex pattern.

A type of the concavo-convex pattern formed as described above is not particularly limited, and may be suitably selected in consideration of a desired haze.

For example, the type of the concavo-convex pattern may be a spherical, hemi-spherical, oval, or amorphous shape, and an average size may be in a range of 1 nm to 100 μm. For example, when the concavo-convex pattern is observed from above, the average size may be a length or diameter, or a height or depth of a dent or groove.

In addition, for example, when the substrate 10 having the same type as shown in FIG. 2 is formed, a volume of the space in the substrate 10 formed by the concavo-convex pattern may be 30 to 91% based on a total volume of the substrate, but the present application is not limited thereto.

Here, as the precursor of the applicable polymer, a polyamic acid may be used. The polyamic acid may form a polyimide by imidization, and when imidization is performed while the mold which can form a concavo-convex pattern is in contact with a layer in a polyamic acid state, a base layer having a concavo-convex pattern on one surface may be formed. However, a type of the base layer or precursor thereof capable of being applied to the present application is not limited thereto.

As the base layer or precursor thereof which can be applied in the manufacturing method, a material known to be conventionally used to realize a flexible element in the art, for example, polyether ether ketone (PEEK), cycloolefin polymer (COP), polyimide (PI), polyethylene naphthalate (PEN), polycarbonate (PC), an acrylic resin, poly(ethylene terephthalate) (PET), poly(ether sulfide) (PES), or polysulfone (PS), or a precursor capable of forming the resin, may be used without particular limitation. Here, as the precursor, a mixture of a monomer capable of forming the polymer, or a partial polymer of the monomer may be used.

In one example, when the base layer applied to an OED is polyimide or polyamic acid, the base layer or the precursor thereof may include a condensation unit of a tetracarboxylic acid dianhydride and a diamine compound, or an imidization unit thereof. The polyimide may be conventionally prepared by preparing a polyamic acid through condensation of a tetracarboxylic acid dianhydride and a diamine compound, and imidizing the amic acid. Accordingly, when a polyimide or a polyamic acid is used as the base layer, the base layer forming the concavo-convex pattern may include the condensation unit of the dianhydride and the diamine compound (that is, a polyamic acid unit) or an imidization unit thereof (that is, a polyimide unit).

A type and a ratio of a dianhydride or diamine compound which can be applied herein is not particularly limited. For example, as the dianhydride or diamine compound, a suitable type may be selected from various types in consideration of a desired refractive index or haze. In addition, a ratio between them may also be selected in a range capable of forming a polyimide.

There are various advantages to use such a material and apply the material to the method, and for example, when the material is applied, a desired haze may be generated by applying a minimum amount of light scattering particles into the substrate or even without applying the light scattering particles. Accordingly, due to the use of the material and the application of the method, a surface on which an organic electronic element is formed may maintain excellent surface smoothness, and thus the organic electronic element formed thereon may exhibit excellent performance. In addition, the above-described material can be freely adjusted in refractive index, when needed, exhibit a haze, and thus can be effectively applied to various applications.

For example, when at least two types of the condensation units forming a polyimide or polyamic acid base layer or an imidization unit thereof are included in the base layer, at least one of the above-described haze and refractive index may be adjusted. In such a case, the base layer may include a condensation unit of a first tetracarboxylic acid dianhydride and a first diamine compound or an imidization unit thereof as a first unit and a condensation unit of a second tetracarboxylic acid dianhydride and a second diamine compound or an imidization unit thereof as a second unit.

Of course, the first unit and the second unit are not necessarily included in the base layer, and when needed, one unit having a suitable physical property may be included in the base layer. For example, when expression of a high refractive index is required, only one unit having a high refractive index may be selected from the units that will be described below, thereby forming the base layer.

The first and second units may be included in one polymer or in a separate polymer, and thus may be present in the base layer. That is, the base layer may include one polymer including the first unit and the second unit, or a polymer including the first unit and a polymer including the second unit. In addition, the first and second units may be chains included in respective polymers, respectively, or polymers.

To adjust at least one of a haze and a refractive index, the first and second units may have different physical properties. For example, the first and second units may have different refractive indexes. The term "refractive index" used herein is, unless particularly defined otherwise, a refractive index measured with respect to light having a wavelength of 550 nm. For example, the absolute value of the difference in refractive index between the first and second units may be 0.01 or more. In another example, the absolute value of the difference in refractive index may be approximately 0.02 or more, 0.03 or more, 0.04 or more, 0.05 or more, or 0.06 or more. The absolute value of the difference in refractive index may be approximately 0.2 or less, 0.15 or less, 0.1 or less, or 0.08 or less. A method of adjusting the refractive indexes of the first and second units as described above is not particularly limited, and for example, the refractive index may be adjusted by selecting a component constituting each unit. For example, as will be described below, a dianhydride and a diamine compound, which form the unit, may be selected from aromatic, aliphatic, and alicyclic dianhydrides, and diamine compounds, respectively. Among these, when an aromatic compound known to conventionally provide a high refractive index is selected, a relatively high refractive index unit may be formed.

In another example, the first and second units may have different polarities. For example, any one or both of the first and second units may include at least one polar functional group. In this case, the absolute value of the difference between a number of moles of polar functional groups included in the first unit and a number of moles of polar functional groups included in the second unit may be 2 or more. In another example, the absolute value of the difference in the number of moles may be 10 or less, 8 or less, 6 or less, or 4 or less. The polar functional group may be substituted to the above-described dianhydride or diamine compound. An applicable type of the polar functional group may be, but is not particularly limited to, a halogen atom such as fluorine or chlorine, a haloalkyl group substituted with a halogen such as fluorine or chlorine, a cyano group, a nitro group, a hydroxyl group, an alkoxy group, a cyanate group, or a thiocyanate group, and for convenience of application, a halogen atom or a haloalkyl group may be used. Here, the haloalkyl group or alkoxy group may be a haloalkyl group or alkoxy group having 1 to 20, 1 to 16, 1 to 12, 1 to 8, or 1 to 4 carbon atoms. The dianhydride or diamine compound substituted with the above-described polar functional group may be known in various types or synthesized by a conventional method.

As described above, a haze of the polyimide base layer may be uniformly adjusted using the difference in refractive index or polarity between the first unit and the second unit. Different types of polyimide mixtures having the difference in refractive index or polarity as described above may form an opaque emulsion, and an opacity of the emulsion is considered to be transferred to a film. Accordingly, the haze of the polyimide film may be adjusted by adjusting the difference in refractive index or polarity of the component for forming an emulsion. In addition, a total refractive index of the film may be easily adjusted by adjusting a ratio of a unit having a high refractive index in this process. As a haze is provided using a unit of a polymer, not by a conventional method of providing a haze using scattering particles, excellent surface smoothness of the polymer, as well as a uniform haze, may be maintained.

A ratio of the first and second units in the base layer is not particularly limited, and may be adjusted in consideration of desired refractive index and haze. For example, the base layer may include the first unit at approximately 3 to 100, 3 to 80, 3 to 60, 3 to 40, 3 to 20, or 3 to 15 parts by weight with respect to 100 parts by weight of the second unit, but the present application is not limited thereto.

A type of the dianhydride or diamine compound forming a polyimide including the first and second units and a method of forming the unit using the same are not particularly limited. In a polyimide-related field, various dianhydrides or diamine compounds capable of synthesizing a polyimide are known, and a suitable type may be selected from such known components and used in consideration of a desired refractive index or polarity.

For example, as an aliphatic, alicyclic, or aromatic tetracarboxylic acid dianhydride which can be used as the dianhydride, butanetetracarboxylic acid dianhydride, pentanetetracarboxylic acid dianhydride, hexanetetracarboxylic acid dianhydride, cyclopentanetetracarboxylic acid dianhydride, bicyclopentanetetracarboxylic acid dianhydride, cyclopropanetetracarboxylic acid dianhydride, methylcyclohexanetetracarboxylic acid dianhydride, 3,3',4,4'-benzophenonetetracarboxylic acid dianhydride, 3,4,9,10-perylenetetracarboxylic acid dianhydride, 4,4'-sulfonyldiphthalic dianhydride, 3,3',4,4'-biphenyltetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6,-pyridinetetracarboxylic acid dianhydride, m-terphenyl-3,3', 4,4'-tetracarboxylic acid dianhydride, p-terphenyl-3,3',4,4'-tetracarboxylic acid dianhydride, 4,4'-oxydiphthalic dianhydride, 1,1,1,3,3,3-hexafluoro-2,2-bis[(2,3 or 3,4-dicarboxyphenoxy)phenyl]propane dianhydride, 2,2-bis[4-(2, 3- or 3,4-dicarboxyphenoxy)phenyl]propane dianhydride, or 1,1,1,3,3,3-hexafluoro-2,2-bis[4-(2,3- or 4-dicarboxyphenoxy)phenyl]propane dianhydride may be used, as an aromatic, aliphatic, or alicyclic diamine compound, an aromatic diamine such as p-phenylenediamine (PDA), m-phenylenediamine (m-PDA), 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis (2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy) phenyl]sulfone, 2,2-bis[4-(4-aminophenoxy)phenyl] propane, 2,2-bis[4-(3-aminophenoxy)phenyl]propane, 2,2-bis[4-(4-aminophenoxy)-phenyl]propane (6HMDA), 2,2'-bis(trifluoromethyl)-benzidine(2,2'-bis(trifluoromethyl) benzidine (TFMB), 3,3'-bis(trifluoromethyl)-4,4'-diaminobiphenyl (3,3'-TFDB), 4,4'-bis(3-aminophenoxy) diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F), or 4,4'-oxydianiline (ODA); or an aliphatic diamine such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, bis(3-aminopropyl)piperazine, 3,9-bis(3-aminopropyl)-2,4,8,10-tetraoxaspiro[5.5]-undecane, or 1,3-bis(3-aminopropyl)tetramethyldisiloxane may be used, but the present application is not limited thereto.

Such a base layer may be a transparent film. The term "transparent film" used herein may be, for example, a film having a transmittance to any one of lights in a visible region or lights in an entire visible region of 50% or more, 60% or more, 70% or more, or 80% or more.

A haze of the base layer may be adjusted, as needed, for example, in a range of approximately 3 to 90%. The term "haze" used herein may be in a range measured according to ASTM D1003 using a tool such as Haze Meter HM-150. Here, another lower limit of the haze may be, for example, approximately 5 or 10%. In addition, another upper limit of the haze may be, for example, approximately 85%, 80%, 75%, 70%, 65%, 60%, 55%, 50%, 45%, 40%, 35%, or 30%. Such a haze may be achieved by adjusting a shape or size of a concavo-convex pattern or a ratio thereof when a concavo-convex pattern is formed in the base layer, or by selecting a polymer unit of the base layer in the above-described method in addition to such a method to make the base layer to have a haze. When such a method is applied, the base layer may exhibit a desired haze by excluding scattering particles or including the minimum amount of scattering particles. The term "scattering particle" used herein may be a particle having a different refractive index from a peripheral matrix, and an average diameter to an extent that incident light is scattered according to a wavelength of the incident light. The base layer of the present application may substantially not include, or include the scattering particles at approximately 10, 8, 6, 4, 2, or 1 wt % or less with respect to a total weight of the base layer.

The base layer may have a coefficient of thermal expansion (CTE) in a range of approximately 5 to 70 ppm/° C. In this range, it is advantageous that a defect such as interlayer delamination which can occur in a structure in which an organic layer and an inorganic layer are mixed is prevented.

The base layer may have a glass transition temperature of approximately 200° C. or more. Such a glass transition temperature may be a glass transition temperature of the base layer, or a glass transition temperature of a base layer having a buffer layer which will be described below formed thereon. Such a range may be suitable for a high temperature process for deposition or patterning in manufacture of an OED. In another example, the glass transition temperature may be approximately 210, 220, 230, 240, or 250° C. or more. The upper limit of the glass transition temperature may be, but is not particularly limited to, for example, approximately 400, 350, or 300° C.

The base layer may have a surface roughness (root mean square; RMS), which is adjusted in a range of approximately 0.1 to 5 nm. Here, the surface roughness is surface roughness of a surface not having a concavo-convex pattern. Such surface roughness may be for a surface of the base layer, or a surface of a buffer layer of the base layer having the buffer layer which will be described below formed thereon. Such a range of the surface roughness is advantageous to improve performance of a layer formed thereon. For example, when an inorganic layer having a barrier property is formed on the base layer, if the inorganic layer is formed on a surface having the above range of surface roughness, a layer having a more excellent moisture blocking property may be formed. In another example, the surface roughness may be approximately 4, 3, 2.5, or 2 nm or less.

The base layer may have a refractive index of approximately 1.4, 1.5, 1.6, 1.7, 1.75, or 1.8 or more. In an OED, such a range of the refractive index of the base layer may be advantageous to increase light efficiency. The upper limit of the refractive index of the base layer may be, but is not particularly limited to, for example, approximately 2.0. To achieve a high refractive index of such a base layer, the refractive index may be adjusted by selecting a unit of constituting the film as described above, or by blending a predetermined amount of a component having a high refractive index.

A thickness of the base layer is not particularly limited, and may be selected in an appropriate range in consideration of a desired performance, for example, flexibility, light extraction efficiency, or a barrier property. For example, the thickness of the base layer may be in a range of approximately 10 to 50 or 20 to 30 μm.

In the method of manufacturing a substrate of the present application, a concavo-convex pattern is formed on one surface of the base layer as described above, and the base layer may be applied to the method of manufacturing an OED without an additional treatment, and when needed, may be applied to an OED as a substrate after an additional treatment.

Here, as the additional treatment, treatment for forming another base layer (hereinafter, a second base layer) on one surface of the base layer having a concavo-convex pattern on one surface may be used. The second base layer may be formed of the same material as or a different material from that for the base layer having a concavo-convex pattern.

Figure 4:
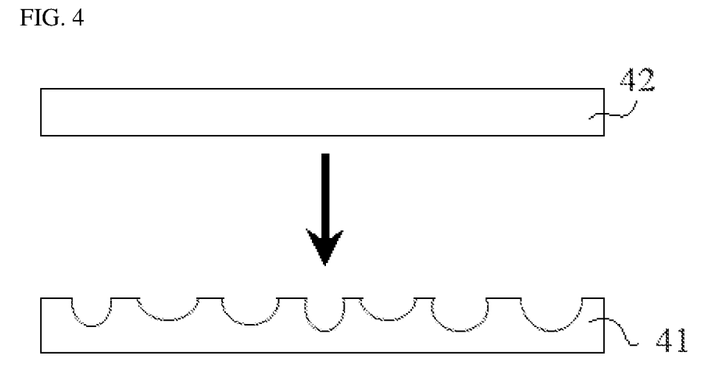
FIG. 4 is a diagram showing the method, by which the base layer is prepared.

FIG. 4 is a schematic diagram showing a process of forming a second base layer 42 on a base layer 41 having a concavo-convex pattern as described above. In FIG. 4, the concavo-convex pattern is not formed on the second base layer 42, but if necessary, a concavo-convex pattern may also be formed in the second base layer 42. Such a concavo-convex pattern may be formed, for example, on a surface of the base layer 42 in contact with the base layer 41 having a concavo-convex pattern.

An additional operation may be an operation of charging another material to a dent formed in the concavo-convex pattern. In the present application, it may be required that the refractive index of the base layer is different from that of the dent shown in FIG. 1 or a space in the base layer 10 shown in FIG. 2, and thus an operation of charging a separate material to the dent may be performed. However, when an air is present in the dent, or a desired haze is exhibited without charge of another material, since the dent is present in a vacuum, the charging operation may be omitted.

As a material which can be charged to the dent, a high refractive material having a high refractive index or a low refractive material having a low refractive index may be used.

Here, as a high refractive material, SiON, $TiO_2$, $SiO_2$, $Al_2O_3$, $Ta_2O_3$, $Ti_3O_3$, $TiO_2$, TiO, $ZrO_2$, $Nb_2O_3$, $CeO_2$, or ZnS may be used, and as a low refractive material, a polymer material such as an epoxy resin may be used, but the present application is not limited thereto. Other than the above-described material, any one of the materials having a different refractive index from that of the base layer by exhibiting a high refractive index or a low refractive index may be used in the process.

A method of charging the material is not particularly limited, and may be, for example, wet coating, chemical vapor deposition, sputtering, or atomic layer deposition (ALD).

As an additional operation, an operation of forming a high refractive layer formed on the base layer may be used. The high refractive layer may be formed on a concavo-convex pattern of the base layer having the concavo-convex pattern, or formed on a surface not having a concavo-convex pattern. The term "high refractive layer" used herein may be a layer having a refractive index with respect to a wavelength of 550 nm of 1.7, 1.8, 1.85, or 1.9 or more. The upper limit of the refractive index of the high refractive layer may be, for example, approximately 2.0. As the high refractive layer is formed on the base layer as described above, a desired performance, for example, light extraction efficiency may be improved.

The high refractive layer may include, for example, high refractive particles in addition to a binder. For example, the high refractive layer may be formed using a composition prepared by mixing high refractive particles with a binder. Here, as the binder, a known material may be used without particular limitation. As the binder, for example, various organic binders, inorganic binders, and organic/inorganic binders known in the art may be used. In consideration of a life span of an element or excellent resistance to a high temperature process, a photo process, or an etching process, which is performed in the manufacturing process, an organic binder, inorganic binder, or organic/inorganic binder having excellent thermal resistance and excellent chemical resistance may be selected. The binder may have a refractive index of, for example, approximately 1.4, 1.45, 1.5, 1.6, 1.65, or 1.7 or more. The upper limit of the refractive index of the binder may be selected in the range satisfying a refractive index of the high refractive layer in consideration of a refractive index of particles blended together. As the binder, for example, a polyimide, polyamic acid, a caldo resin having a fluorene ring, urethane, epoxide, polyester, or acrylate-based thermal or photocurable monomeric, oligomeric, or polymeric organic material; an inorganic material such as silicon oxide, silicon nitride, silicon oxynitride, an epoxy resin, or polysiloxane; or a composite material of an organic material and an inorganic material may be used.

The high refractive layer may further include high refractive particles. The term "high refractive particle" used herein may be, for example, a particle having a refractive index of 1.8, 2.0, 2.2, 2.5, 2.6, or 2.7 or more. The upper limit of the refractive index of the high refractive particle may be selected in the range satisfying a refractive index of the high refractive layer, for example, in consideration of the refractive index of the binder blended together. The high refractive particles may have an average diameter of, for example, approximately 1 to 100, 10 to 90, 10 to 80, 10 to 70, 10 to 60, 10 to 50, or 10 to 45 nm. As the high refractive particles, for example, alumina, alumino silicate, titanium oxide, or zirconium oxide may be used. As the high refractive particles, for example, particles having a refractive index of 2.5 or more, such as rutile-type titanium oxide may be used. The rutile-type titanium oxide may have a higher refractive index than other particles, and thus a desired refractive index can be adjusted by a relatively low ratio. A ratio of the high refractive particles in the high refractive layer is not particularly limited, and may be adjusted in the range in which the refractive index of the above-described high refractive layer can be ensured.

An inorganic layer may be present on the base layer, and in some cases, the inorganic layer may serve as the above-described high refractive layer. The term "inorganic layer" used herein may be a layer including 50% or more or 60% of an inorganic material based on a weight. The inorganic layer may include only an inorganic material, or another component such as an organic material if including an inorganic material in the above range.

The inorganic layer may be, for example, a barrier layer. The term "barrier layer" used herein may be a layer capable of preventing, inhibiting, or reducing the permeation of an external factor, for example, water or vapor, which can have a bad influence on the performance of an element such as an organic layer. For example, the barrier layer may have a water vapor transmission rate (WVTR) of $10^{-4}$ g/m$^2$/day or less. In the specification, the WVTR may be a value measured using a measurer (for example, PERMATRAN-W3/31, MOCON, Inc.) at 40° C. and a relative humidity of 90%.

The barrier layer may be formed of any one of the materials known to reduce, prevent, or inhibit the permeation of the external factors such as water and oxygen. The material may be a material known as a metal such as In, Sn, Pb, Au, Cu, Ag, Al, Ti, or Ni; a metal oxide such as TiO, $TiO_2$, $Ti_3O_3$, $Al_2O_3$, MgO, SiO, $SiO_2$, GeO, NiO, CaO, BaO, $Fe_2O_3$, $Y2O_3$, $ZrO_2$, $Nb_2O_3$, or $CeO_2$; a metal nitride such as SiN; a metal oxynitride such as SiON; a metal fluoride such as $MgF_2$, LiF, $AlF_3$, or $CaF_2$; an absorbing material having an absorbance of 1% or more or a water-proof material having an absorption coefficient of 0.1% or less.

The inorganic layer may have a low degree of crystallinity, or may be substantially amorphous. When the inorganic layer is formed by general deposition, due to the properties of the material, it has a high chance to perform crystallization, and thus it is not easy to satisfy the described degree of crystallinity. However, the inorganic layer satisfying the above-described degree of crystallinity may be formed by employing any one of a method of substituting an inorganic layer with an oxide layer such as a metal oxide, a method of repeatedly forming a thin layer, a method of controlling adjacent sublayers to have different materials during the repeatedly forming of the thin layers, and a method of forming each sublayer using a different material, however, all of the sublayers being formed as oxide layers such as metal oxide layers.

It is suitable that the inorganic layer may have a small difference in refractive index from the base layer. In this case, particularly, it can contribute to formation of a substrate having excellent light extraction efficiency. For example, the absolute value of the difference in refractive index between the inorganic layer and the base layer may be approximately 1, 0.7, 0.5, or 0.3 or less. Accordingly, when the base layer has a high refractive index as described above, the inorganic layer should also have a refractive index at the same level. For example, the refractive index of the inorganic layer may be approximately 1.5, 1.6, 1.7, or 1.75 or more. When the OED to which the substrate of the present application is applied is an OLED, the range of the refractive index of the base layer may be advantageous to increase the light efficiency of the device. The upper limit of the refractive index of the inorganic layer may be, for example, but is not particularly limited to, approximately 2.0.

A thickness of the inorganic layer may be determined according to an effect caused by a desired use, and in one example, the range of the thickness may be, but is not particularly limited to, approximately 10 to 100, 10 to 90, 10 to 80, 10 to 70, 10 to 60, 10 to 50, or 20 to 50 nm.

While the inorganic layer may have a monolayer or multilayer structure, it may be required to have a multilayer structure to satisfy the above-described degree of crystallinity. The multilayer structure may include a structure in which the same type or different types of inorganic layers are stacked. The formation of the inorganic layer in a multilayer structure may contribute to the formation of an inorganic layer having the above-described interfacial cohesive property and having the above-described degree of crystallinity. In addition, the formation of the inorganic layer in a multilayer structure may contribute to the formation of an inorganic layer having the above-described refractive index.

The inorganic layer having a multilayer structure may include at least a stack structure of a first sublayer and a second sublayer. In consideration of the interfacial cohesive property, the degree of crystallinity, the barrier property or the refractive index required for the inorganic layer, thicknesses of the first and second sublayers may be adjusted. For example, the thicknesses of the first and second sublayers may all be adjusted in a range of 7, 6, 5, 4, 3, or 2 nm or less. The lower limit of the thickness of the sublayer is not particularly limited. As the thickness of the sublayer is smaller, the contribution to the adjustment of the interfacial cohesive property, the degree of crystallinity, the barrier property, and the refractive index may be increased, but when the thickness of the sublayer is smaller, a required number of processes may be increased to reach a desired thickness. Accordingly, the lower limit of the thickness of the sublayer may be determined in a suitable range according to a desired thickness, etc., and may be adjusted to approximately 0.1 nm or more.

In consideration of the interfacial cohesive property, the degree of crystallinity, the barrier property, and the refractive index, the thicknesses of all sublayers included in the inorganic layer having a multilayer structure may be adjusted in the above range. In this case, the inorganic layer may not include a sublayer having a thickness of more than 10, 9, 8, 7, 6, or 5 nm.

The number of the sublayers included in the inorganic layer is not particularly limited. It may be determined according to the thickness of the sublayer and the thickness of the desired inorganic layer. In one example, the inorganic layer may include 2 to 50 sublayers. In this range, 4, 6, 8, or 10 or more sublayers may be included. In addition, in this range, 45, 40, 35, 30, 25, 20, or 15 or less sublayers may be included. When the inorganic layer includes 3 or more sublayers, all of the sublayers may be the first or second sublayers, and in addition, a third sublayer or a higher sublayer may be included.

The sublayer may be formed of one of various materials, and may be formed of an oxide, a nitride, or an oxynitride of various metals or non-metals to contribute to the interfacial cohesive property, the degree of crystallinity, the barrier property, and the refractive index. Accordingly, the first and second sublayers may be oxide layers, nitride layers, or oxynitride layers. When needed, all of the sublayers included in the inorganic layer may be formed of the oxide. A type of the oxide capable of being used in this case may be suitably selected from oxides capable of forming the above-described barrier layer without particular limitation. Among the sublayers, sublayers in contact with each other may contribute to the interfacial cohesive property, the degree of crystallinity, the barrier property, and the refractive index as long as the sublayers are formed of different materials. Accordingly, when the first and second sublayers are in contact with each other, the different materials may be, for example, different oxides, nitrides, or oxynitrides. Even though the inorganic layer includes a third sublayer, a fourth sublayer, or a higher sublayer as described above, it is advantageous that the sublayers in contact with each other may be formed of different materials, for example, different oxides.

The first sublayer may have a first refractive index, and the second sublayer may have a second refractive index different from the first refractive index. When such a layer is stacked, it is advantageous that the above-described effect may be ensured and the refractive index of the inorganic layer may be adjusted in the above range. The absolute value of the difference between the first refractive index and the second refractive index may be, for example, 0.1 or more. The absolute value may be, in another example, 0.2, 0.3, 0.4, 0.5, or 0.6 or more. In addition, the absolute value may be, in another example, in a range of 2, 1.8, 1.6, 1.4, or 1.2 or less. The ranges of the first and second refractive indexes are not particularly limited, as long as the range of the refractive index is ensured, but for example, the refractive index of the first sublayer may be in a range of 1.4 to 1.9, and the refractive index of the second sublayer may be in a range of 2.0 to 2.6. The first and second sublayers may be metal oxide layers. For example, a suitable material of the first sublayer may be $Al_2O_3$, and a suitable material of the second sublayer may be $TiO_2$. As long as the above range of refractive index may be obtained and a final stack structure may have a barrier property, various materials, as well as those described above, may be applied.

While the inorganic layer or each sublayer may be formed by a known method, to ensure the interfacial cohesive property, it is advantageous that it is formed by atomic layer deposition (ALD). The ALD may include a process of alternately depositing a precursor such as an organic metal and a precursor such as water on an adherend surface, and in this process, monolayers of the precursors may be alternately formed and reacted with each other to form the inorganic layer. When a predetermined functional group, for example, the above-described hydroxyl group, is included in the base layer, a layer formed by the ALD may react with the functional group during the formation, thereby ensuring the desired interfacial cohesive property. Unless particularly defined otherwise, the term "ALD layer" used herein may be an inorganic layer formed by ALD.

A method of forming an inorganic layer or a sublayer which can be applied, other than the ALD, may include physical vapor deposition (PVD) such as sputtering, pulsed laser deposition (PLD), electron beam evaporation, thermal evaporation, or laser molecular beam epitaxy (L-MBE), or a chemical vapor deposition (CVD) such as metal organic chemical vapor deposition (MOCVD), hydride vapor phase epitaxy (HYPE), initiated chemical vapor deposition (iCVD), or plasma enhanced chemical vapor deposition (PECVD). When needed, a suitable one of the above methods may be selected according to a material to be used, thereby maximizing performance of the inorganic layer.

The substrate of the present application may include an additional layer. For example, the substrate of the present application may further include a buffer layer between the inorganic layer and the base layer to achieve an interfacial cohesive property between the inorganic layer and the base layer. Accordingly, the method may further include an operation of forming a buffer layer on the base layer. For example, when a buffer layer and an inorganic layer are sequentially formed on the base layer having a concavo-convex pattern, the structure described above may be realized. However, the buffer layer is not a necessary component, and for example, as long as the interfacial cohesive property is achieved, the buffer layer may not be required.

The substrate of the present application may further include an electrode layer present on the inorganic layer or the base layer. Accordingly, the manufacturing method may further include an operation of forming an electrode layer on the base layer or the inorganic layer.

As an electrode layer, a hole injection or electron injection electrode layer conventionally used in the OED may be used. The electrode layer may be a transparent electrode layer, or a reflective electrode layer.

The hole injection electrode layer may be formed of, for example, a material having a relatively high work function, and when needed, may be formed of a transparent or reflective material. For example, the hole injection electrode layer may include a metal, an alloy, an electro conductive compound having a work function of approximately 4.0 eV or more, or a mixture of at least two thereof. Such a material may be a metal such as gold, CuI, indium tin oxide (ITO), indium zinc oxide (IZO), zinc tin oxide (ZTO), aluminum- or indium-doped zinc oxide, magnesium indium oxide, nickel tungsten oxide, an oxide such as ZnO, $SnO_2$, or $In_2O_3$, a metal nitride such as gallium nitride, a metal selenide such as zinc selenide, or a metal sulfide such as zinc sulfide. A transparent hole injection electrode layer may also be formed of a stack of a metal thin film such as Au, Ag, or Cu and a high refractive transparent material such as ZnS, $TiO_2$, or ITO.

The hole injection electrode layer may be formed by an optional means such as deposition, sputtering, chemical deposition, or an electrochemical means. In addition, the electrode layer formed according to its use may be patterned through a known photolithography or a process using a shadow mask.

The electron injection electrode layer may be formed of, for example, a material having a relatively low work function, and may be formed of, for example, a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

In another aspect, the present application provides a substrate for an organic electronic element. The descriptions for the method of manufacturing the substrate may be applied to the substrate in the same manners.

That is, the substrate may be manufactured by the above-described method, and may be a polymer base layer having a concavo-convex pattern on at least one surface. In addition, the substrate may include a second polymer base layer formed on a surface having a concavo-convex pattern of the polymer base layer, and have a space therein due to the concavo-convex pattern. Such a structure may be, for example, a structure shown in FIG. 2.

The above description may be applied to a material for the polymer base layer, a dent of the concavo-convex pattern, a material which can be charged into the internal space, or a layer additionally formed on the base layer.

In still another aspect, the present application provides a method of manufacturing an OED. The method of manufacturing an OED may include an operation of manufacturing an OED using the base layer as a substrate. In yet another aspect, the present application provides an OED manufactured by the above method. The method of manufacturing an OED using the above-described base layer may be a known method without particular limitation. For example, the OED may include a base layer which is the above-described substrate for an OED, and an element region present on the substrate. The element region may include a first electrode layer, an organic layer, and a second electrode layer, and the OED may be manufactured by forming the electrode layer or the organic layer on the base layer formed as described above by a known method. In addition, when the above-described electrode layer is previously formed on the substrate for an OED, the electrode layer may serve as the first electrode layer.

An illustrative OED may include the base layer, a first electrode layer, an organic layer, a second electrode layer, a second inorganic layer, and a cover film, which are sequentially present in an upper direction. The layers may be directly stacked in a state in which a different layer is not present between adjacent layers, or stacked by means of another layer.

The term "upper direction" used herein means, unless particularly defined otherwise, a direction from the first electrode layer to the second electrode layer, and the term "lower direction" used herein means, unless particularly defined otherwise, a direction from the second electrode layer to the first electrode layer.

Herein, for convenience of explanation in the specification, a region including all components (excluding a first electrode layer) present under the first electrode layer in the structure is referred to as a substrate region, a region including a first electrode layer, a second electrode layer, and all components present between them is referred to as an element region, and a region including all components (excluding a second electrode layer) present above the second electrode layer is referred to as an upper region.

The substrate region may further include another layer in addition to the above-described base layer. As the layer additionally present in the substrate region, a carrier substrate, a barrier film, or an adhesive layer may be used.

As another layer which can be included in the substrate region, a barrier film may be used. In terms of characteristics of a material such as a glass substrate, compared to a rigid structure using a substrate having an excellent barrier property, in a flexible structure, a base layer having a relatively low barrier property is applied, and thus to compensate a barrier property, an additional barrier film may be present, for example, under the base layer. As the barrier film, a film having a suitable barrier property and transparency when needed may be used without particular limitation.

The barrier film may be adhered to the base layer, for example, by an adhesive layer. Here, the barrier film may be adhered to an opposite surface to the surface of the base layer on which the element region is formed. The term "adhesive layer" used herein includes a layer formed using a material called a pressure-sensitive adhesive or a material called a pressure-sensitive adhesive/adhesive, in addition to a material conventionally called an adhesive. A material for forming the adhesive layer may be a known pressure-sensitive adhesive/adhesive material such as an acrylic polymer, a silicon polymer, a rubber-based polymer, an ethylene vinyl acetate (EVA) polymer, or an olefin polymer such as polyisobutylene (PIB).

A suitable water-proof material may be blended in the adhesive layer. Hereinafter, the term "adhesive layer blended with the water-proof material" used herein may be an adhesive layer having a barrier property. The term "water-proof material" used herein may be used as a component which can adsorb or remove water or vapor introduced from an external environment through a physical or chemical reaction. A specific type of the water-proof material which can be blended with the adhesive layer may be, but is not particularly limited to, one or a mixture of at least two of, for example, a metal oxide, an organic metal oxide, a metal salt, and phosphorus pentoxide ($P_2O_5$). Here, a specific example of the metal oxide may be, but is not limited to, lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

Suitable scattering particles may be blended in the adhesive layer, and thus the adhesive layer may exhibit a suitable haze. When the adhesive layer exhibits a haze, light extraction efficiency may be improved. A type of the scattering particles which can be blended in the adhesive layer is not particularly limited, and a suitable type of the scattering particles included in the scattering layer may be selected in consideration of the refractive index of a resin for forming the adhesive layer.

As another layer which may be present in the substrate region, a carrier substrate which can be temporarily or permanently adhered under the base layer may be used. Conventionally, as the carrier substrate, a rigid substrate such as a glass substrate may be applied.

The substrate region may be formed in various structures. For example, the substrate region may have a structure in which the base layer 10 having the shape shown in FIG. 1 or 2 is present alone, or the above-described high refractive layer or inorganic layer and the base layer 10 having the shape shown in FIG. 1 or 2 are sequentially formed in a lower direction, a structure in which the above-described buffer layer is formed between the high refractive layer or inorganic layer and the base layer, or a structure in which a carrier film or a barrier film is adhered under the base layer by an adhesive layer when needed.

An organic layer is present between the first and second electrode layers. The organic layer may include at least one or two emitting units. In such a structure, light generated from the emitting unit may be emitted to a transparent electrode layer through reflection by a reflective electrode layer.

When at least two emitting units are present, for suitable emission, an intermediate electrode layer or charge-generating layer (CGL) may be further present between the plurality of emitting units. Accordingly, the emitting units may be divided by the intermediate electrode layer or CGL having a charge-generating characteristic.

A material constituting the emitting unit is not particularly limited. Fluorescent or phosphorescent organic materials having various emission center wavelengths are known in the art, and a suitable type of the known materials may be selected to form the emitting unit. The material for the emitting unit may be, but is not limited to, an Alq-based material such as tris(4-methyl-8-quinolinolate)aluminum (III) (Alg3), 4-MAlq3, or Gaq3; a cyclopentadiene derivative such as C-545T ($C_{26}H_{26}N_2O_2S$), DSA-amine, TBSA, BTP, PAP-NPA, spiro-FPA, PhTDAOXD ($Ph_3Si$), or 1,2,3,4,5-pentaphenyl-1,3-cyclopentadiene (PPCP); 4,4'-bis(2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, bon$_2$Ir(acac), $(C_6)_2$Ir(acac), bt$_2$Ir(acac), dp$_2$Ir(acac), bzq$_2$Ir(acac), bo$_2$Ir(acac), F$_2$Ir(bpy), F$_2$Ir(acac), op$_2$Ir(acac), ppy$_2$Ir(acac), tpy$_2$Ir(acac), fac-tris[2-(4,5'-difluorophenyl)pyridine-C'2,N]iridium(III) (Flrppy), or bis(2-(2'-benzo[4,5-a]thienyl)pyridinato-N,C3') iridium(acetylactonate) (Btp$_2$Ir(acac)). The emitting unit may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emission characteristic selected from electron accepting organic compounds or electron donating organic compounds, which will be described below.

The organic layer may be formed in various structures further including various other functional layers known in the art, as long as it includes the emitting unit. As a layer capable of being included in the organic layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene, or a derivative thereof; or a heterocyclic compound such as phenanthroline, bathophenanthroline, phenanthridine, acridine, quinoline, quinoxaline, or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephenylenedimethylidine, 9,10-anthracenediyldimethylidine, or 4,4'-(2,2-di-tibutylphenylvinyl)biphenyl, or 4,4'-(2,2-diphenylvinyl) biphenyl or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styrylamine derivative disclosed in a patent publication such as Japanese Patent Laid-Open Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the element by preventing approach of injected holes to an electron injection electrode layer through the emitting unit, and may be formed in a suitable part between the emitting unit and the electron injection electrode layer using a known material when needed.

The hole injection layer or hole transport layer may include, for example, an electron donating organic compound. As the electron donating organic compound, N,N', N'-tetraphenyl-4,4'-diaminophenyl, N,N'-diphenyl-N,N'-di (3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4''-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorene, or 4,4''-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, π-conjugated polymers such as polyparaphenylenevinylene and a derivative thereof, hole transport non-conjugated polymers such as poly(N-vinylcarbazole), or σ-conjugated polymers such as polysilane may also be used.

The hole injection layer may be formed using an electrically-conductive polymer such as a metal phthalocyanine such as copper phthalocyanine or a non-metal phthalocyanine, a carbon film, and polyaniline, or may be formed by a reaction with a Lewis acid using the aryl amine compound as an oxidizing agent.

A particular structure of the organic layer is not particularly limited. Various materials and methods for forming a hole or electron injection electrode layer and an organic layer, for example, an emitting unit, an electron injection or transport layer, or a hole injection or transport layer are known in the art, and all of the methods may be applied to manufacture the OED.

An upper region of the OED may include an inorganic layer and a cover film, which are sequentially formed in an upper direction. To discriminate the inorganic layer from that of the substrate for an OED, the inorganic layer included in the upper region may be referred to as a second inorganic layer, and the inorganic layer included in the substrate may be referred to as a first inorganic layer.

The second inorganic layer is present to prevent, inhibit, or reduce the permeation of external materials, thereby obtaining durability, and a specific material and a forming method may be similar to those described in the category of the first inorganic layer. However, when the second inorganic layer is designed to emit light to the substrate region, it is not necessary to form the second inorganic layer to have a high refractive index, unlike the first inorganic layer.

A cover film present on the second inorganic layer may be a structure for protecting an OED, which is, for example, a known barrier film, metal sheet, or conductive film, or a stack structure of at least two thereof. The cover film in the upper region may be adhered to a top surface of the second inorganic layer by an adhesive layer, for example, the above-described adhesive layer having a barrier property.

In yet another aspect, the present application provides a use of the OED, for example, an OLED. The OLED may be effectively applied to a backlight of a liquid crystal display (LCD), lighting devices, sensors, a light source of a printer or copy machine, a light source for an automobile gauge, a signal light, a pilot lamp, a display device, a light source for a planar emitting device, a display, decorations, or other kinds of lighting devices. In one example, the present application relates to a lighting device including the organic light emitting element. When the organic light emitting element is applied to the lighting device or for different uses, other components constituting the device or a method of constituting the device is not particularly limited, but all of optional materials or methods known in the corresponding field may be employed as long as the organic light emitting element is used.

Effect

According to the present application, a method of manufacturing a substrate which can provide an OED having an element with improved efficiency can be provided. The present application can also provide a method of manufacturing a substrate which has excellent surface smoothness and a suitably controlled refractive index or light scattering property according to a desired use, and thus can form an OED having excellent reliability and efficiency. The present application can also provide a substrate manufactured by the above-described method, an OED, and their uses. The manufacturing method of the present application can be effectively applied, for example, to manufacture a flexible element.

EXPLANATION OF THE MARKS

10: the base layer, substrate or the precursor of the base layer
20: the organic electronic device
30: the mold
41, 42: the base layer Illustrative Embodiments Hereinafter, illustrative embodiments of the present application will be described in detail with reference to examples according to the present application. However, the scope of the present application is not limited to the embodiments which will be disclosed below.

PREPARATION EXAMPLE 1

Preparation of Polyimide Substrate (A)

A polyamic acid solution (a composition for forming a film, refractive index: approximately 1.625) was synthesized through a condensation reaction of 3,3',4,4'-biphenyltetracarboxylic dianhydride (BPDA) and p-phenylene diamine (PDA) in a reactor. Subsequently, the synthesized polyamic acid solution was imidized on a mold 30 having a concavo-convex pattern on a surface as shown in FIG. 3, and coated to form a layer having a thickness of approximately 10 μm. Afterward, the coated layer was heated in an oven at a rate of approximately 2° C./min and maintained at 80° C. for 15 minutes, at 150° C. for 30 minutes, at 220° C. for 30 minutes, and at 350° C. for 1 hour to perform imidization, thereby forming a first polyimide layer. Subsequently, a substrate (A) was manufactured by laminating a second polyimide layer formed by the same method as described above to face concavo-convex patterns each other. A haze of the substrate (A) measured using a Haze Meter HM-150 according to ASTM D1003 was approximately 5%, and light transmittance was approximately 85%.

PREPARATION EXAMPLE 2

Preparation of Polyimide Substrate (B)

A polyimide substrate (B) was manufactured by the same method as described in Preparation Example 1, except that a composition for forming a film prepared by mixing a first polyamic acid solution (refractive index: approximately 1.56) prepared by condensation of BPDA and 2,2'-bis(trifluoromethyl)benzidine (TFMB) and a second polyamic acid solution (refractive index: approximately 1.541) prepared by condensation of 2,2'-bis-(3,4-dicarboxyphenyl) hexafluoropropane dianhydride (FDA) and TFMB in a ratio (the first polyamic acid:the second polyamic acid) of 5:95 based on a weight of a solid content was used. A haze of the substrate (B) measured using a Haze Meter HM-150 according to ASTM D1003 was approximately 5.12%, and light transmittance was approximately 86.4%.

PREPARATION EXAMPLE 3

Preparation of Polyimide Substrate (C)

A polyimide substrate (C) was manufactured by the same method as described in Preparation Example 1, except that a composition for forming a film prepared by mixing a first polyamic acid solution (refractive index: approximately 1.56) prepared by condensation of BPDA and TFMB and a second polyamic acid solution (refractive index: approximately 1.541) prepared by condensation of FDA and TFMB in a ratio (the first polyamic acid:the second polyamic acid) of 10:90 based on a weight of a solid content was used. A haze of the substrate (C) measured using a Haze Meter HM-150 according to ASTM D1003 was approximately 16.44%, and light transmittance was approximately 83.5%.

PREPARATION EXAMPLE 4

Preparation of Polyimide Substrate (D)

A polyimide substrate (D) was manufactured by the same method as described in Preparation Example 1, except that a composition for forming a film prepared by mixing a first polyamic acid solution (refractive index: approximately 1.625) prepared by condensation of BPDA and PDA and a second polyamic acid solution (refractive index: approximately 1.56) prepared by condensation of BPDA and TFMB in a ratio (the first polyamic acid:the second polyamic acid) of 10:90 based on a weight of a solid content, and further blending a high refractive filler (rutile $TiO_2$, refractive index: approximately 2.8) having a range of a diameter without having a scattering property was used. A haze of the substrate (D) measured using a Haze Meter HM-150 according to ASTM D1003 was approximately 9%, light transmittance was approximately 81%, and a refractive index was approximately 1.8.

EXAMPLE 1

A device having the shape show in FIG. 2 was prepared by forming an organic electronic element on the polyimide substrate (A) manufactured in Preparation Example 1. An OED was manufactured by forming an element region formed by sequentially forming a hole injection transparent electrode layer, a hole transport layer, a first emitting unit having an emission wavelength of approximately 380 to 500 nm, an n-type organic semiconductor layer, a p-type organic semiconductor layer, a second emitting unit having an emission wavelength of approximately 500 to 700 nm, a hole blocking layer, an electron transport layer, an electron injection layer, and an electron injection reflective electrode layer on the substrate (A) using a known material, and encapsulating the element region with a suitable encapsulating material. Quantum efficiency of the manufactured OED, which was measured by a known method was approximately 35.4%.

EXAMPLE 2

An organic electronic element was formed on the substrate (B) manufactured in Preparation Example 2. First, a barrier layer was formed on the polyimide substrate (B). The barrier layer was formed to obtain a final refractive index of approximately 1.8 by alternately depositing an $Al_2O_3$ layer having a refractive index of approximately 1.6 to 1.8 in single deposition and a $TiO_2$ layer having a refractive index of approximately 2.0 to 2.4 in single deposition according to atomic layer deposition (ALD). The $Al_2O_3$ layer was formed by alternately adsorbing a trimethylaluminum layer as a precursor and a water ($H_2O$) layer at approximately 200° C. according to the known ALD, and the $TiO_2$ layer was also formed by alternately adsorbing a $TiCl_4$ layer as a precursor and a water ($H_2O$) layer at approximately 200° C. according to the known ALD. In this case, the barrier layer was formed to have a final thickness of approximately 40 nm by adjusting each of thicknesses of the $Al_2O_3$ layer and the $TiO_2$ layer to be in a range of approximately 2 to 5 nm. Subsequently, an OED was manufactured by forming an element region by sequentially forming a hole injection transparent electrode layer, a hole transport layer, a first emitting unit having an emission wavelength within in a range of 380 to 500 nm, an n-type organic semiconductor layer, a p-type organic semiconductor layer, a second emitting unit having an emission wavelength within a range of approximately 500 to 700 nm, a hole blocking layer, an electron transport layer, an electron injection layer, and an electron injection reflective electrode layer using a known material on the barrier layer, and encapsulating the element region with a suitable encapsulating material. Quantum efficiency of the manufactured OED, which was measured by a known method was approximately 41.6%.

EXAMPLE 3

An organic electronic element was formed by the same method as described in Example 1, except that the substrate (C) prepared in Preparation Example 3 was applied. Quantum efficiency of the manufactured OED, which was measured by a known method was approximately 41.6%.

EXAMPLE 4

An organic electronic element was formed by the same method as described in Example 1, except that the substrate (D) prepared in Preparation Example 4 was applied. Quantum efficiency of the manufactured OED, which was measured by a known method was approximately 42%.

COMPARATIVE EXAMPLE 1

An organic electronic element was formed by the same method as described in Example 1, except that a polyimide substrate not having a concavo-convex pattern, manufactured by coating the composition for forming a film, which was the same as that used in Preparation Example 1 to a thickness of approximately 20 μm. Quantum efficiency of the manufactured OED, which was measured by a known method was approximately 31.9%.

What is claimed is:

1. A method of manufacturing a substrate for an organic electronic device, comprising:
   forming a concavo-convex pattern on at least one surface of a first polymer base layer or a layer of a precursor of the first polymer base layer, and
   forming a second base layer on the surface of the first polymer base layer or the layer of the precursor thereof having the concavo-convex pattern so as to form a space due to the concavo-convex pattern between the first polymer base layer or the layer of the precursor thereof and the second base layer.

2. The method according to claim 1, wherein the forming of a concavo-convex pattern includes forming the first polymer base layer or the layer of the precursor thereof on a mold having a concavo-convex pattern on its surface to be in contact with the concavo-convex pattern of the mold.

3. The method according to claim 1, wherein a concavo-convex pattern is formed on a surface of the second base layer facing the concavo-convex pattern of the first polymer base layer or layer of precursor of the first polymer base layer.

4. The method according to claim 1, wherein the first polymer base layer or the precursor thereof has a refractive index with respect to light with a wavelength of 550 nm of 1.4 or more.

5. The method according to claim 1, wherein a haze of the first polymer base layer or precursor thereof is in a range of 3 to 90%.

6. The method according to claim 1, further comprising:
   charging a material having a different refractive index from that of the first polymer base layer or layer of precursor thereof into a dent of the concavo-convex pattern.

7. The method according to claim 6, wherein the material having a different refractive index from that of the first polymer base layer or layer of precursor thereof is SiON, $TiO_2$, $SiO_2$, $Al_2O_3$, $Ta_2O_3$, $Ti_3O_3$, $TiO_2$, TiO, $ZrO_2$, $Nb_2O_3$, $CeO_2$, ZnS, or an epoxy resin.

8. The method according to claim 1, wherein the first polymer base layer or the layer of the precursor thereof includes a condensation unit of tetracarboxylic acid dianhydride and a diamine compound or an imidization unit thereof.

9. The method according to claim 1, wherein the first polymer base layer or the layer of the precursor thereof includes a copolymer including a condensation unit of a first tetracarboxylic acid dianhydride and a first diamine compound or an imidization unit thereof as a first unit and a condensation unit of a second tetracarboxylic acid dianhydride and a second diamine compound or an imidization unit thereof as a second unit.

10. The method according to claim 1, wherein the first polymer base layer or the layer of the precursor thereof includes a first polymer including a condensation unit of a first tetracarboxylic acid dianhydride and a first diamine compound or an imidization unit thereof as a first unit and a second polymer including a condensation unit of a second tetracarboxylic acid dianhydride and a second diamine compound or an imidization unit thereof as a second unit.

11. The method according to claim 9, wherein the absolute value of the difference in refractive index between the first unit and the second unit is 0.01 or more.

12. The method according to any one of claims claim 9, wherein the absolute value of the difference between the number of moles of polar functional groups included in the first unit and the number of moles of polar functional groups included in the second unit is 2 or more.

13. A substrate for an organic electronic device, comprising:
 a first polymer base layer having a concavo-convex pattern on at least one surface thereof, and
 a second polymer base layer formed on a surface of the first polymer base layer having the concavo-convex pattern,
 wherein a space is formed due to the concavo-convex pattern between the first polymer base layer and the second polymer base layer.

14. A method of manufacturing an organic electronic device, comprising:
 forming a concavo-convex pattern on at least one surface of a first polymer base layer,
 forming a second polymer base layer on the surface of the first polymer base layer having the concavo-convex pattern so as to form a space due to the concavo-convex pattern between the first polymer base layer and the second polymer base layer; and
 forming an organic electronic element on the first polymer base layer using the first polymer and the second polymer base layers having the space therebetween as a substrate.

15. An organic electronic device, comprising:
 a substrate comprising a first polymer base layer having a concavo-convex pattern on at least one surface thereof;
 a second polymer base layer formed on the surface of the first polymer base layer having the concavo-convex pattern; and
 an element region formed on a surface not having the concavo-convex pattern of the first polymer base layer,
 wherein a space is formed due to the concavo-convex pattern between the first polymer base layer and the second polymer base layer.

16. A light source for a display, comprising:
 the organic electronic device of claim 15.

17. A lighting device, comprising:
 the organic electronic device of claim 15.

* * * * *